US011112479B2

(12) United States Patent
Roebroeck et al.

(10) Patent No.: US 11,112,479 B2
(45) Date of Patent: Sep. 7, 2021

(54) METHOD AND A MRI APPARATUS FOR OBTAINING IMAGES OF A TARGET VOLUME OF A HUMAN AND/OR ANIMAL SUBJECT USING MAGNETIC RESONANCE IMAGING (MRI)

(71) Applicants: UNIVERSITEIT MAASTRICHT, Maastricht (NL); ACADEMISCH ZIEKENHUIS MAASTRICHT, Maastricht (NL)

(72) Inventors: Alard Roebroeck, Maastricht (NL); Benedikt Poser, Maastricht (NL); Francisco Lagos Fritz, Maastricht (NL)

(73) Assignees: UNIVERSITEIT MAASTRICHT, Maastricht (NL); ACADEMISCH ZIEKENHUIS MAASTRICHT, Maastricht (NL)

( * ) Notice: Subject to any disclaimer, the term of this patent is extended or adjusted under 35 U.S.C. 154(b) by 0 days.

(21) Appl. No.: 16/757,098

(22) PCT Filed: Oct. 15, 2018

(86) PCT No.: PCT/EP2018/077991
§ 371 (c)(1),
(2) Date: Apr. 17, 2020

(87) PCT Pub. No.: WO2019/076782
PCT Pub. Date: Apr. 25, 2019

(65) Prior Publication Data
US 2020/0241097 A1 Jul. 30, 2020

(30) Foreign Application Priority Data

Oct. 19, 2017 (EP) .................................... 17197326

(51) Int. Cl.
| | |
|---|---|
| *G01V 3/00* | (2006.01) |
| *G01R 33/561* | (2006.01) |
| *G01R 33/28* | (2006.01) |
| *G01R 33/483* | (2006.01) |
| *G01R 33/56* | (2006.01) |
| *G01R 33/565* | (2006.01) |

(52) U.S. Cl.
CPC ......... *G01R 33/561* (2013.01); *G01R 33/288* (2013.01); *G01R 33/4835* (2013.01); *G01R 33/5602* (2013.01); *G01R 33/5659* (2013.01)

(58) Field of Classification Search
CPC .............. G01R 33/543; G01R 33/5659; G01R 33/3415; G01R 33/36; A61B 5/055
(Continued)

(56) References Cited

FOREIGN PATENT DOCUMENTS

EP 0 184 840 A1 6/1986

OTHER PUBLICATIONS

International Search Report and Written Opinion, Int'l Patent Application No. PCT/EP2018/077991, dated Jan. 15, 2019, 15 pages.
(Continued)

*Primary Examiner* — Walter L Lindsay, Jr.
*Assistant Examiner* — Frederick Wenderoth
(74) *Attorney, Agent, or Firm* — Casimir Jones, S.C.; Robert A. Goetz

(57) ABSTRACT

The invention also relates to a MRI apparatus for obtaining images of a target volume of a human and/or animal subject using magnetic resonance imaging (MRI), said MRI apparatus at least comprising: a housing defining a target area for accommodating said human and/or animal subject; at least one main magnet unit and at least one magnetic gradient unit for applying—during use—one or more magnetic field gradients along three independent orthogonal spatial axes in said target area, as well as at least one radiofrequency (RF) pulse generation unit for applying one or more sets of RF pulses towards said target area; a RF receiving unit for acquiring MRI signals possibly having multi-channel spa-
(Continued)

tially sensitive characteristics; and a computer processing unit for processing said acquired MRI signals and for producing said magnetic resonance image data.

16 Claims, 4 Drawing Sheets

(58) Field of Classification Search
USPC .......................................................... 324/309
See application file for complete search history.

(56) References Cited

OTHER PUBLICATIONS

Sattin W. "Quick Step—A Time Saving NMR Imaging Scheme Utilizing Stimulated Echoes" Proceedings of the International Society for Magnetic Resonance in Medicine, Fifth Annual Meeting, Aug. 19, 1986, pp. 932-933.

Finsterbusch J. et al. "Multi-Slice Single-Shot Line Scan Imaging Using Stimulated Echoes" Proceedings of the International Society for Magnetic Resonance in Medicine, Sixth Scientific Meeting and Exhibition, Apr. 18, 1998, 1 page.

Cremillieux Y. et al. "Steam-Burst: Application to Sub-Second Multi-Slice Acquisition" Proceedings of the International Society for Magnetic Resonance in Medicine, Fourth Scientific Meeting, Apr. 27, 1996, 1 page.

Fritz F.J. et al. "Kt-dSTEAM: high resolution diffusion-weighted imaging of the ex vivo human brain using B1+ homogenized STEAM at 9.4T" Proceedings of the International Society for Magnetic Resonance in Medicine, 25th Annual Meeting, No. 173, Apr. 7, 2017, 4 pages.

Markus Barth et al. "Simultaneous multislice (SMS) imaging techniques: SMS Imaging" Magnetic Resonance in Medicine, vol. 75, No. 1, Aug. 26, 2015, pp. 63-81.

METHOD AND A MRI APPARATUS FOR OBTAINING IMAGES OF A TARGET VOLUME OF A HUMAN AND/OR ANIMAL SUBJECT USING MAGNETIC RESONANCE IMAGING (MRI)

CROSS REFERENCE TO RELATED APPLICATIONS

The present application is a 371 U.S. National Phase Entry of pending International Application No. PCT/EP2018/077991, filed Oct. 15, 2018, which claims priority to EP 17197326.6, filed Oct. 19, 2017, each of which are herein incorporated by reference in their entireties.

FIELD OF THE INVENTION

The invention relates to a method for obtaining images of a target volume of a human and/or animal subject using magnetic resonance imaging (MRI).

The invention also relates to a MRI apparatus for obtaining images of a target volume of a human and/or animal subject using magnetic resonance imaging (MRI), said MRI apparatus at least comprising: a housing defining a target area for accommodating said human and/or animal subject; at least one main magnet unit and at least one gradient magnet unit for applying—during use—one or more magnetic field gradients along three independent orthogonal spatial axes in said target area, as well as at least one radiofrequency (RF) pulse generation unit for applying one or more sets of RF pulses towards said target area; a RF receiving unit for acquiring MRI signals possibly having multi-channel spatially sensitive characteristics; and a computer processing unit for processing said acquired MRI signals and for producing said magnetic resonance image data.

BACKGROUND OF THE INVENTION

Magnetic resonance imaging (MRI) is a medical imaging technique used in radiology to form images of the anatomy and the physiological processes of a target volume in the body of a human and/or animal subject, in both health and disease. MRI apparatuses implement strong magnetic fields, radio waves, and field gradients to generate images of the target volume.

MRI does not involve X-rays or other ionizing radiation, which distinguishes it from computed tomography (CT or CAT) and this imaging technique thus avoids the health hazards of X-rays. Moreover MRI can often yield different diagnostic information compared with CT imaging techniques. However, compared with CT, MRI scans typically take more time, the clinical environment and the technology used are noisier, and usually require that the subject under examination has to be positioned in a narrow, confined tube (the target area). In addition, human or animal subjects with some medical implants or other non-removable metal inside the body may be unable to safely undergo an MRI examination.

In general, MRI is one of the most used medical imaging modalities for diagnostics of soft tissues in the body. MRI is non-invasive, since it does not need to use ionizing radiation or intra-venous contrast substances (although contrast-fluid enhanced MRI is also used in the clinic). In addition, it is a highly flexible imaging modality because, depending on the pulse sequence program (in short 'sequence'), it can image a large range of contrasts (e.g. proton density-, T1-, T2-, T2*-diffusion-weighted) in the target volume.

However, despite its strong advantages, the MRI technique has two disadvantages, which stand in the way of an even greater market share in soft tissue clinical diagnostics: the measurement time and the presence of image artifacts.

First, measurement time for high quality images in MRI is long compared to other commonly used medical imaging techniques. MRI systems are developing toward increasing main field strength (from 1.5 Tesla to 3 Tesla in the clinic and from 3 Tesla to 7 Tesla in preclinical investigations; the first clinical 7T system has already been announced), because higher fields offer higher efficiency and, thus, shorter scan times for the same image quality or higher image quality (higher contrast-to-noise or higher spatial resolution) in the same time. However, even at high (3T) and ultra-high field strength (UHF, i.e. 7T and beyond) measurement times are long (with ensuing high cost), especially when the increased efficiency is leveraged for more sensitive diagnostics enabled by higher quality scans.

Second, image artifacts are plentiful and common in MRI images. In particular, artifacts due to radiofrequency field (B1) effects, such as transmit and receive field inhomogeneity, distort the clinically important image contrast. Unfortunately, B1 field inhomogeneity is greater at higher field strengths, which leads to increased B1 induced artifacts at higher fields (3T and 7T).

DESCRIPTION OF THE INVENTION

The invention aims to provide a solution for the above identified problems, allowing an order-of-magnitude speedup in acquiring T1-, T2- and diffusion-weighted images. This high speed of scanning allows many (tens of) imaging volumes to be acquired in short time. These are then suitable for calculating quantitative images which are relatively free of B1 artifacts. As such the invention can be implemented on high and ultra high field (UHF, notably 7 Tesla) scanners without being as limited by specific absorption rate (SAR) as most existing T1-, T2 and diffusion-weighted acquisition techniques are.

According to the invention the method for obtaining images of a target volume of a human and/or animal subject using magnetic resonance imaging (MRI) comprising at least the steps of:

A applying, to said human and/or animal subject being positioned in an MRI scanning apparatus, during subsequent total block times $TB_j$ with $j \in [1, 2, \ldots, K]$ a first set of spatially selective RF pulses (Exc0-Sto0-Rec0) in a sequence block $SB_{(j,0)}$, with in a sub-sequence block $SB^A_{(j,0)}$ of said sequence block $SB_{(j,0)}$ at least a first RF pulse (Exc0) at $t=t_{1(j,0)}$ and a second RF pulse (Sto0) at $t=t_{2(j,0)}$ and in a sub-sequence block $SB^B_{(j,0)}$ of said sequence block $SB_{(j,0)}$ at least a third RF pulse (Rec0) at $t=t_{3(j,0)}$, with $t_{1(j,0)} < t_{2(j,0)} < t_{3(j,0)}$, with each RF pulse simultaneously exciting respective $M_0$ slices in the target volume of the human and/or animal subject, thereby causing the subject to emit MRI signals, said MRI signals at least comprising stimulated-echo (STE) MRI signals producing data for $M_0$ slices in said target volume;

B acquiring during said total block times $TB_j$ at least the MRI signals with at least a RF receiving unit having spatial sensitive characteristics; and C computer-processing the MRI signals as acquired with said RF receiving unit in order to produce magnetic resonance image data for each of said $M_0$ slices of the target volume; and wherein the method further comprises the step of:

D applying, to said human and/or animal subject being positioned in said MRI scanner, at least a further sequence block $SB_{(j,0)}$ (with $i \in [1, \ldots, N]$) of spatially selective RF pulses ($Exc_i$-$StO_i$-$Rec_i$), with in a sub-sequence block $SB^A_{(j,i)}$ of said further sequence block $SB_{(j,i)}$ at least a first RF pulse ($Exc_i$) at $t=t_{1(j,0)}$ and a second RF pulse ($StO_i$) at $t=t_{2(j,0)}$ and in a sub-sequence block $SB^B_{(j,0)}$ of said sequence block $SB_{(j,i)}$ at least a third RF pulse ($Rec_i$) at $t=t_{3(j,0)}$, with $t_{1(j,i)} < t_{2(j,i)} < t_{3(j,i)}$ and with sub-sequence block $SB^A_{(j,i)}$ taking place after sub-sequence block $SB^A_{(j,i-1)}$ but prior to sub-sequence block $SB^B_{(j,i-1)}$ and with sub-sequence block $SB^B_{(j,i)}$ taking place after sub-sequence block $SB^B_{(j,i-1)}$, with each RF pulse simultaneously exciting respective $M_i$ slices in the target volume of the human and/or animal subject, thereby causing the subject to emit further MRI signals, said further MRI signals at least comprising stimulated-echo (STE) MRI signals producing further data for $\Sigma^N_{i=1} M_i$ slices in said target volume.

By applying a next set of spatially selective RF pulses for a different set of $M_i$ slices in the target volume during the time sequence at which the MRI signals (in particular the (STE) MRI signals) corresponding to the previous set of spatially selective RF excitation pulses are being acquired, a significant increase in the speed of scanning is obtained, allowing much more imaging volumes to be acquired in the same time. Similarly these are also suitable for calculating quantitative images which are relatively free of B1 artifacts.

In particular said MRI signals also comprises spin-echo (SE) MRI signals acquired in sub-sequence block $SB^A_{(j,i)}$, allowing more quantitative image information to be acquired.

In particular each set i (with $i \in [0, 1, \ldots, N]$) of spatially selective RF pulses comprises:

the RF excitation pulse ($Exc_i$) exhibiting a flip angle $\alpha 1$ exciting magnetization into the transverse plane, the RF storing pulse ($StO_i$) exhibiting a flip angle $\alpha 2$ for refocussing one part of the magnetization into a spin-echo, thereby causing the subject to emit, during said total block time $TB_j$ N+1 spin-echo MRI signals, and storing another part of the magnetization along the longitudinal axis, and the RF recalling pulse ($Rec_i$) exhibiting a flip angle $\alpha 3$ for recalling the magnetization, which was stored along the longitudinal axis, to the transverse plane into a stimulated-echo, thereby causing the subject to emit, during said total block time $TB_j$, N+1 stimulated-echo MRI signals and where each $StO_i$ and $Rec_i$ RF pulse are each surrounded by two gradient pulses with a defined vector orientation over three orthogonal gradient axes.

As such, the method and apparatus according to the invention are suitable for implementing a stimulated echo acquisition mode (STEAM), which interleaves and temporally multiplexes acquisitions and allows for more imaging volumes to be acquired in the same time sequence, thus reducing filling the dead time and increasing the duty cycle and increasing the scanning speed.

In an example of the method according to the invention for each sequence block $SB_{(j,i)}$ each of the sets of RF pulses being applied comprises a RF pulse $Exc_i$ applied at $t=t_{1(j,i)}$, a RF pulse $StO_i$, applied at $t=t_{2(j,i)}$ and a RF pulse $Rec_i$ applied at $t=t_{3(j,i)}$, with $t_{1(j,i)} < t_{2(j,i)} < t_{3(j,i)}$, and with $t_{1(j,i-1)} < t_{1(j,i)}$, $t_{2(j,i-1)} < t_{2(j,i)}$, $t_{3(j,i-1)} < t_{3(j,i)}$ and with $t_{2(j,i-1)} < t_{1(j,i-1)}, \ldots, t_{1(j,N)} < t_{3(j,i-1)}$ and with $t_{2(j,i-1)} < t_{2(j,i)}, \ldots, t_{2(j,N)} < t_{3(j,i-1)}$.

In particular the method according to the invention comprises the steps of:

the steps of:

between $t_{2(j,i)}$ and $t_{3(j,i)}$ acquiring T2-weighted and diffusion-weighted spin-echo (SE) MRI signals;

after $t_{3(j,i)}$ acquiring T1, T2 and diffusion-weighted stimulated-echo (STE) MRI signals.

In a further example the sets of RF pulses are a sequence of RF pulses with flip angle with flip angle $0° < \alpha_i \leq 180°$, in particular the $Exc_i$ RF excitation pulse of each sequence block exhibits a flip angle $0° < \alpha_i \leq 180°$, and the $StO_i$ RF storing pulse of each sequence exhibits a flip angle $0° < \alpha_2 \leq 180°$ and the $Rec_i$ RF recalling pulse of each sequence exhibits a flip angle $0° < \alpha_3 \leq 180°$.

In a further example $M_i = M$ for $i \in [0, 1, \ldots, N]$ in which case the total number of slices acquired from in a total block time is (N+1)*M. In another example $TB_j = TB$ for $j \in [0, 1, \ldots, K]$.

Moreover in a further example of the method each RF pulse is a single-band or multi-band/simultaneous multi-slice RF pulse, or wherein each slice selected by a single-band or multi-band pulse is spatially encoded along the slice direction by additional phase encoding.

In the method and apparatus according to the invention each RF storing pulse is surrounded by two gradient pulses ($q1_i$-$q2_i$, with $i \in [0, 1, \ldots, N]$), respectively, with a defined vector orientation over three orthogonal gradient axes, and each RF recalling pulse is surrounded by two gradient pulses ($q3_i$-$q4_i$, with $i \in [0, 1, \ldots, N]$), respectively, with a defined vector orientation over three orthogonal gradient axes and in a further example $q1_i = q1$ for $i \in [0, 1, \ldots, N]$, $q2_i = q2$ for $i \in [0, 1, \ldots, N]$, $q3_i = q3$ for $i \in [0, 1, \ldots,]$, and $q4_i = q4$ for $i \in [0, 1, \ldots, N]$, and $q1_i = q2_i = q4_i$ for $i \in [0, 1, \ldots, N]$.

In an example of the MRI scanning apparatus according to the invention, for obtaining images of a target volume of a human and/or animal subject using magnetic resonance imaging (MRI), said MRI scanning apparatus at least comprises a housing defining a target area for accommodating said human and/or animal subject; at least one main magnet unit and at least one magnetic gradient unit for applying—during use—one or more magnetic gradient fields in said target area, as well as at least one radiofrequency (RF) pulse generation unit for applying, during subsequent total block times $TB_j$ with $j \in [1, 2, \ldots, K]$. a first set of spatially selective RF pulses (Exc0-Sto0-Rec0) in a sequence block $SB_{(j,0)}$, with in a sub-sequence block $SB^A_{(j,0)}$ of said sequence block $SB_{(j,0)}$ at least a first RF pulse (Exc0) at $t=t_{1(j,0)}$ and a second RF pulse (Sto0) at $t=t_{2(j,0)}$ and in a sub-sequence block $SB^B_{(j,0)}$ of said sequence block $SB_{(j,0)}$ at least a third RF pulse (Rec0) at $t=t_{3(j,0)}$, with $t_{1(j,0)} < t_{2(j,0)} < t_{3(j,0)}$, with each RF pulse simultaneously exciting respective $M_0$ slices in the target volume of the human and/or animal subject, thereby causing the subject to emit MRI signals, said MRI signals at least comprising stimulated-echo (STE) MRI signals producing data for $M_0$ slices in said target volume; a RF receiving unit for acquiring during said total block time $TB_j$ said MRI signals having spatial sensitive characteristics; and a computer processing unit for processing said acquired MRI signals and for producing said magnetic resonance image data, wherein said (RF) pulse generation unit is arranged to apply, to said human and/or animal subject being positioned in said MRI scanner, at least a further set i (with $i \in [1, \ldots, N]$) of spatially selective RF pulses ($Exc_i$-$Sto_i$-$Rec_i$) in a further sequence block $SB_{(j,i)}$ (with $i \in [1, \ldots, N]$), with in a sub-sequence block $SB^A_{(j,i)}$ of said further sequence block $SB_{(j,i)}$ at least a RF pulse $Exc_i$ at $t=t_{1(j,i)}$ and a RF pulse $Sto_i$ at $t=t_{2(j,i)}$ and in a sub-sequence block $SB^B_{(j,i)}$ of said sequence block $SB_{(j,i)}$ at least a RF pulse $Rec_i$ at $t=t_{3(j,i)}$, with $t_{1(j,i)} < t_{2(j,i)} < t_{3(j,i)}$ and with sub-sequence block $SB^A_{(j,i)}$ taking place after sub-sequence block $SB^A_{(j,i-1)}$ but prior to sub-sequence block $SB^B_{(j,i-1)}$ and with sub-sequence block $SB^B_{(j,i)}$ taking place after sub-sequence block $SB^B_{(j,i-1)}$, with each RF pulse simultaneously exciting respective $M_i$ slices in the target volume of the human and/or animal subject, thereby causing the subject to emit further MRI signals, said further MRI signals at least comprising stimulated-echo (STE) MRI signals producing further data for $\Sigma^N_{i=1} M_i$ slices in said target volume.

Likewise, by applying a next set of spatially selective RF pulses for a different set of $M_i$ slices in the target volume during the time at which the MRI signals corresponding to the previous set of spatially selective RF pulses are being acquired or received by means of the RF receiving unit, with the MRI scanning apparatus according to the invention a significant increase in the speed of scanning is obtained, allowing much more imaging volumes to be acquired in the same time sequence. Similarly these are also suitable for calculating quantitative images which are relatively free of B1 artifacts.

In a further example of the MRI scanning apparatus said RF pulse generation unit is arranged in applying a set i (with $i \in [0, 1, \ldots, N]$) of spatially selective RF pulses, of which the RF excitation pulse ($Exc_i$) exhibiting a flip angle $\alpha 1$ exciting magnetization into the transverse plane, the RF storing pulse ($Sto_i$) exhibiting a flip angle $\alpha 2$ for refocussing one part of the magnetization into a spin-echo, thereby causing the subject to emit, during said total block time $TB_j$, N+1 spin-echo MRI signals, and storing another part of the magnetization along the longitudinal axis, and the RF recalling pulse ($Rec_i$) exhibiting a flip angle $\alpha 3$ for recalling the magnetization, which was stored along the longitudinal axis, to the transverse plane into a stimulated-echo, thereby causing the subject to emit, during said total block time $TB_j$, N+1 stimulated-echo MRI signals and where each $Sto_i$ and $Rec_i$ RF pulse are each surrounded by two gradient pulses with a defined vector orientation over three orthogonal gradient axes.

As such, the method and apparatus according to the invention are suitable for implementing stimulated echo acquisition mode (STEAM), which allows for more imaging volumes to be acquired in the same time sequence thus increasing scanning speed.

In particular said RF pulse generation unit is furthermore arranged in applying, for each sequence block $SB_{(j,i)}$ and for each of the sets of RF pulses, a RF pulse $Exc_i$ applied at $t=t_{1(j,i)}$, a RF pulse $Sto_i$ applied at $t=t_{2(j,i)}$ and a RF pulse $Rec_i$ applied at $t=t_{3(j,i)}$, with $t_{1(j,i)} < t_{2(j,i)} < t_{3(j,i)}$, and with $t_{1(j,i-1)} < t_{1(j,i)}$, $t_{2(j,i-1)} < t_{2(j,i)}$, $t_{3(j,i-1)} < t_{3(j,i)}$ and with $t_{2(j,i-1)} < t_{1(j,i)}, \ldots, t_{1(j,N)} < t_{3(j,i-1)}$ and with $t_{2(j,i-1)} t_{2(j,i)}, \ldots, t^{2(j,N)} < t^{3(j,i-1)}$.

In yet a further example the RF receiving unit is further arranged in acquiring between $t_{2(j,i)}$ and $t_{3(j,i)}$ T2-weighted and diffusion-weighted spin-echo (SE) MRI signals; and acquiring after $t_{3(j,i)}$ T1, T2 and diffusion-weighted stimulated-echo (STE) MRI signals.

The MRI scanning apparatus according to a further example is characterized in that said RF pulse generation unit is furthermore arranged to apply the sets of RF pulses as a sequence of RF pulses with flip angle with flip angle $0° < \alpha_i \leq 180°$, wherein in particular the $Exc_i$ RF excitation pulse of each sequence exhibits a flip angle $0° < \alpha_1 \leq 180°$, and the $Sto_i$ RF storing pulse of each sequence exhibits a flip angle $0° < \alpha_2 \leq 180°$ and the $Rec_i$ RF recalling pulse of each sequence exhibits a flip angle $0° < \alpha_3 \leq 180°$.

In a further example of the MRI scanning apparatus each RF pulse is a single-band or multi-band/simultaneous multi-slice RF pulse, or wherein each slice selected by a single-band or multi-band pulse is spatially encoded along the slice direction by additional phase encoding.

BRIEF DESCRIPTION OF THE DRAWINGS

The invention will now be described in more detail with reference to the accompanying drawings, which drawings show in.

DETAILED DESCRIPTION OF THE INVENTION

Figure 1A:
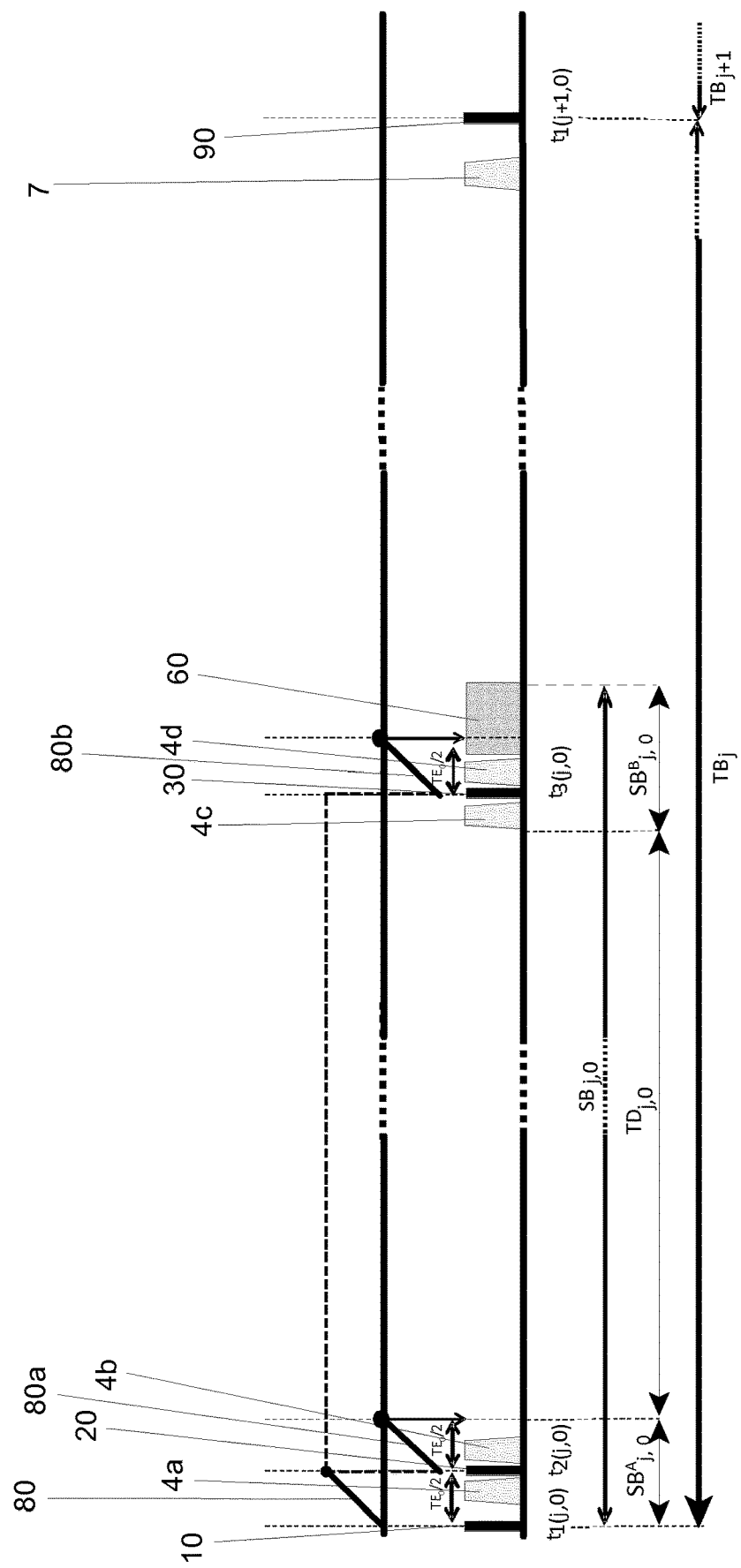
FIG. 1a a schematic example of a MRI pulse sequence according to the state of the art.
Figure 1B:
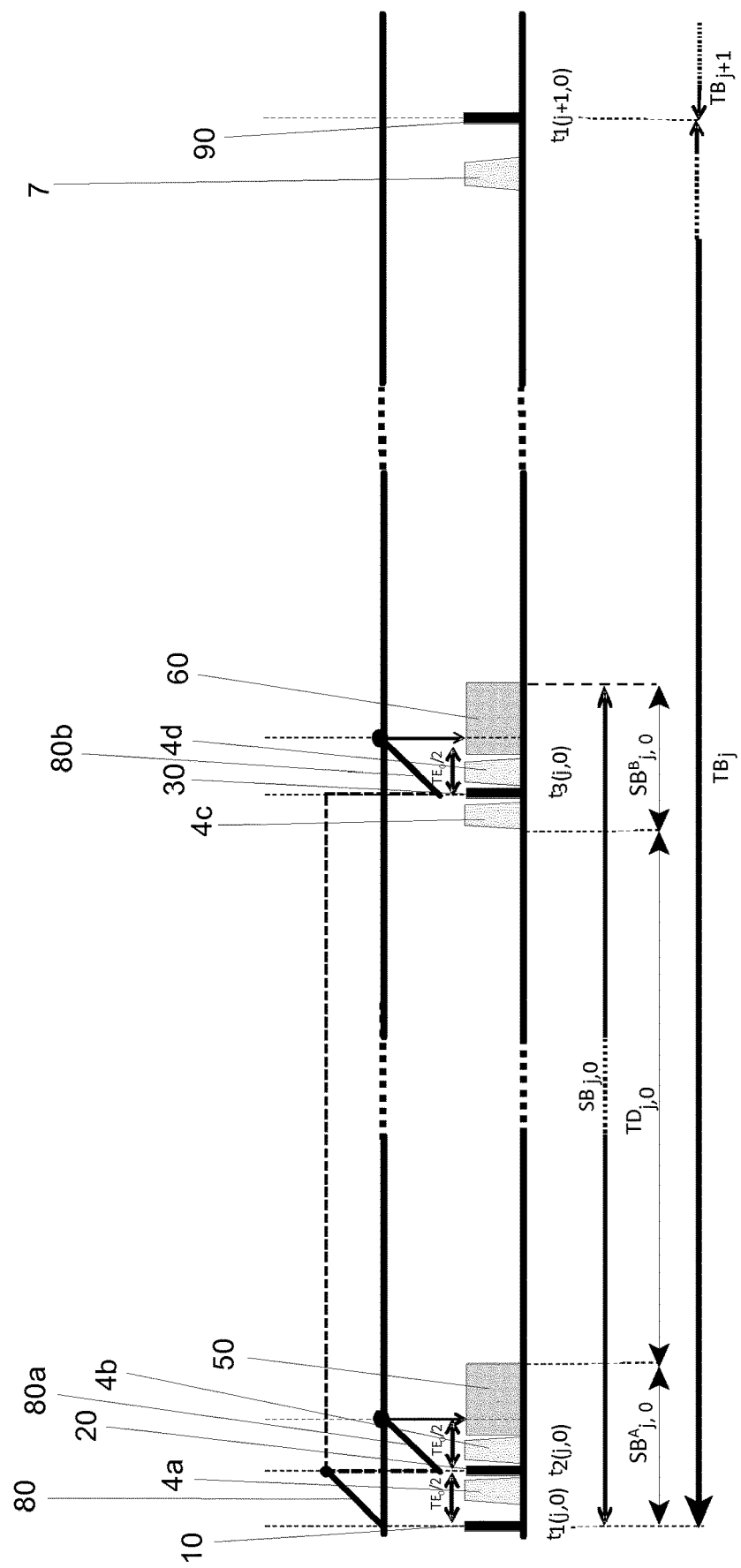
FIG. 1b another schematic example of a MRI pulse sequence according to the state of the art.

Schematic examples of a MRI scanning sequence as performed in accordance with the state of the art and using a MRI scanning apparatus according to the state of the art are shown in FIGS. 1a and 1b, respectively. In both FIGS. 1a-1b time is depicted along the horizontal axis and the sequence of RF pulses, gradient pulses and read out events being generated and applied during said time sequence are displayed.

The MRI scanning sequence according to the state of the art and as depicted in FIG. 1a is considered being a stimulated echo acquisition mode (STEAM) sequence, consisting of three spatially selective RF-pulses to excite, store and recall the magnetization in the target area, where a human or animal subject is being positioned.

The three spatially selective RF pulses belonging to STEAM sequence excite, store and recall the magnetization and are denoted with the reference numerals 10-20-30 respectively. Each sequence of respective excitation, storing and recalling RF pulses can also be denoted with Exc0-Sto0-Rec0 respectively.

It is noted that the set of spatially selective RF pulses 10-20-30 manipulate magnetization of a certain set of $M_0$ slices in the target volume of the human and/or animal being under examination.

With $TB_j$ (with $j \in [1, \ldots, K]$) the total block time is denoted during which time interval the set of spatially selective RF pulses 10-20-30 are applied to the human/animal subject under examination, as well as gradient pulses are applied, as well as all image readouts are performed in order to obtain the respective MRI signals and during each next or following total block time $TB_{j+1}$ a further set of spatially selective RF pulses will be applied and the respective readouts acquired, until the complete target volume has been imaged once, after which the complete target volume can then be imaged again.

Following the set of spatially selective RF pulses 10-20-30 being applied at $t_{1(j,0)}$, $t_{2(j,0)}$ and $t_{3(j,0)}$ respectively, as depicted in FIG. 1a, after $t_{3(j,0)}$ the RF receiving unit acquires T1, T2 and diffusion-weighted MRI signals in readout 60 (also denoted as stimulated-echo readout STE-RO 0).

Additionally and as depicted in the STEAM-sequence of FIG. 1b between $t_{2(j,0)}$ and $t_{3(j,0)}$ T2-weighted and diffusion-weighted MRI signals in readout 50 (denoted as spin-echo readout SE-RO 0) are acquired with the RF receiving unit having spatial sensitive characteristics of the MRI scanning apparatus, whereas after $t_{3(j,0)}$ the RF receiving unit acquires T1, T2 and diffusion-weighted MRI signals in readout 60 (also denoted as stimulated-echo readout STE-RO 0).

With $SB_{(j,0)}$ is indicated the sequence block time during which time interval the set of spatially selective RF pulses 10-20-30 as well as the gradient pulses 4a-4d are applied to the human/animal subject under examination until the end of the readout of the stimulated-echo signals 60. $SB^A_{(j,0)}$ denotes the (first) sub-sequence block time of the sequence block time $SB_{(j,0)}$ during which sub-time interval the gradient pulses 4a-4b as well as the excitation Exc0 and storing Sto0 RF pulses (10-20) are applied (see FIGS. 1a and 1b) and optionally (see FIG. 1b) also the spin-echo SE-RO signals 50 are read out. $SB^B_{(j,0)}$ indicates the (second) sub-sequence block time, which sub-time interval comprises the application of the gradient pulses 4c-4d as well as the recalling RF pulse Rec0 (30) until the end of the readout of the stimulated-echo signals (STE) 60.

$TD_{j,0}$ denotes a so-called dead time period between the sub-sequence block time intervals $SB^A_{(j,0)}$ and $SB^B_{(j,0)}$.

Figure 2A:
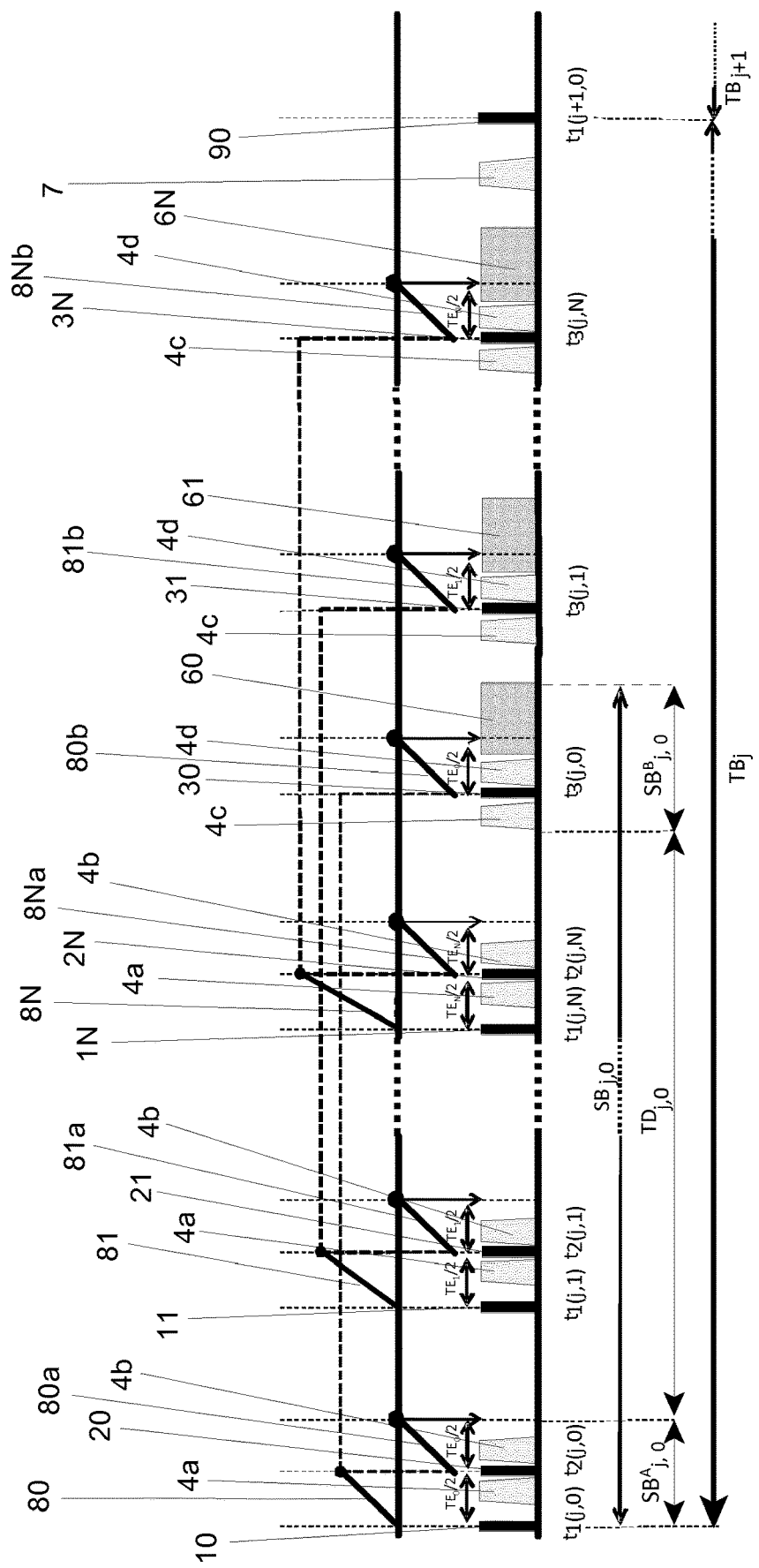
FIG. 2a a schematic example of a MRI pulse sequence according to the method of the invention.
Figure 2B:
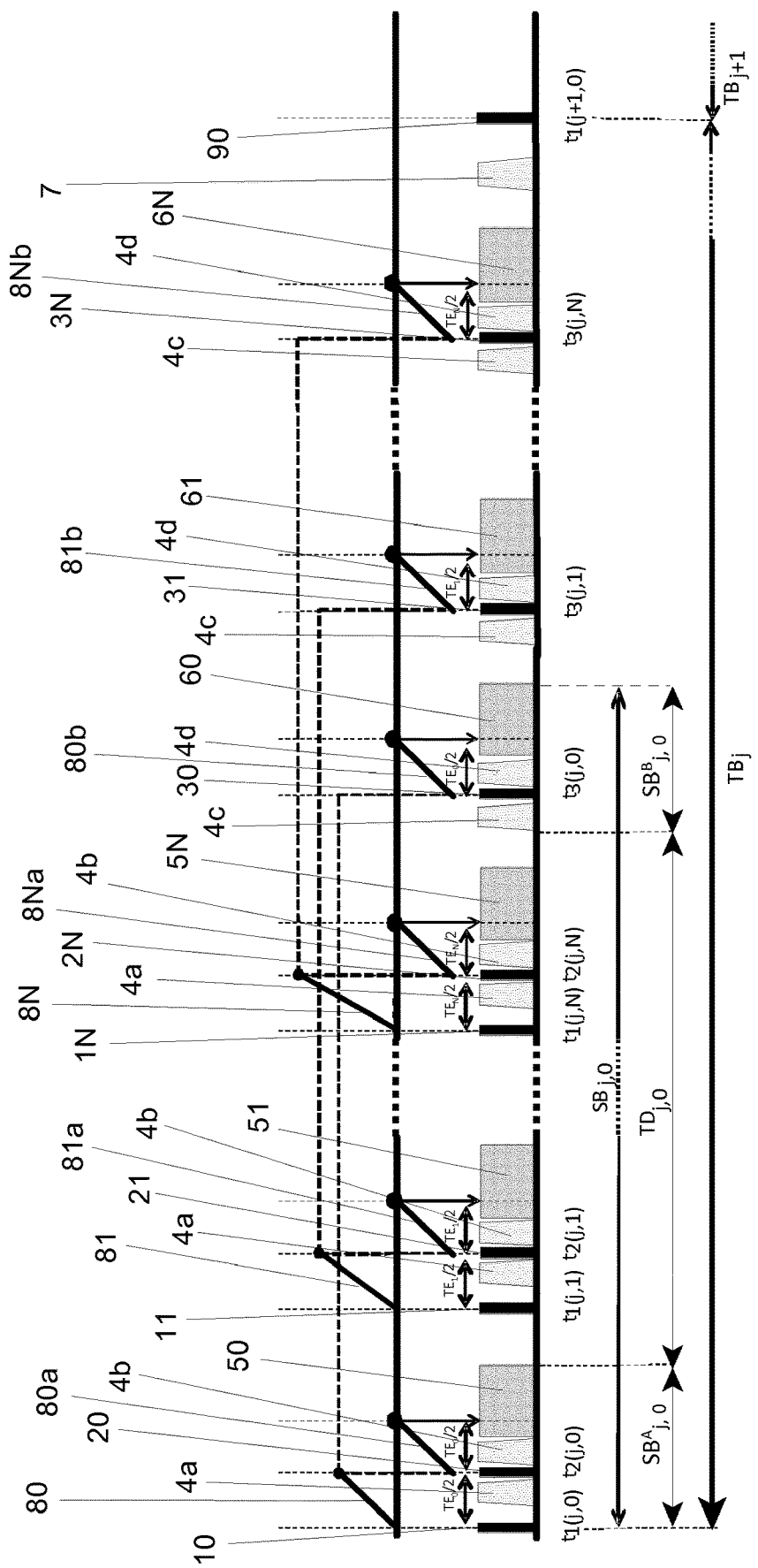
FIG. 2b another schematic example of a MRI pulse sequence according to the method of the invention.

A schematic example of a MRI scanning sequence as performed in accordance with the features of the method according to the invention and using a MRI scanning apparatus according to the invention is shown in FIG. 2a, with a further variant of said example being depicted in FIG. 2b. Similar to FIGS. 1a and 1b also FIGS. 2a and 2b depict time along the horizontal axis and the several RF and gradient pulses and signal readouts being generated and applied during said time sequence.

The MRI scanning sequence according to the invention is in this example derived from the stimulated echo acquisition mode (STEAM) sequence as depicted and described in FIGS. 1a-1b, said STEAM sequence consisting of three spatially selective RF pulses to excite, store and recall the magnetization of the magnetic fields applied in the target area, where a human or animal subject is positioned.

For clarity reasons, it is noted that in FIGS. 2a-2b the last digit '0', '1', . . . , 'N' in the respective reference numerals denote the respective pulses belonging to interleaved sequence block number 0, 1, . . . , N, respectively. Thus, there are N+1 interleaved sequences blocks in total within one total block time $TB_j$.

The three spatially selective RF pulses belonging to the interleaved sequence block numbers 0, 1, . . . , excite, store and recall the magnetization and are denoted with the reference numerals 10-20-30, 11-21-31, . . . , 1N-2N-3N, respectively. Each sequence of respective excitation, storing and recalling RF pulses can also be denoted with Exc0-Sto0-Rec0 (10-20-30), Exc1-Sto1-Rec1 (11-21-31), ExcN-StoN-RecN (1N-2N-3N).

Also here, the first set of spatially selective RF pulses (Exc0-Sto0-Rec0) are applied during a sequence block time interval $SB_{(j,0)}$, with in a sub-sequence block time interval $SB^A_{(j,0)}$ of said sequence block time interval $SB_{(j,0)}$ at least the first RF pulse (Exc0, 10) at $t=t_{1(j,0)}$ and the second RF pulse (Sto0, 20) at $t=t_{2(j,0)}$ and in a sub-sequence block time interval $SB^B_{(j,0)}$ of said sequence block time interval $SB_{(j,0)}$ at least the third RF pulse (Rec0, 30) at $t=t_{3(j,0)}$, with $t_{1(j,0)} < t_{2(j,0)} < t_{3(j,0)}$ or, more generally $t_1 < t_2 < t_3$. This corresponds with the known stimulated echo acquisition mode (STEAM) sequence as described with reference to FIGS. 1a and 1b.

It is noted that interleaved sub-sequence 0 corresponds with the set (i=0) of spatially selective RF pulses 10-20-30 for a certain set of $M_0$ slices in the target volume of the human and/or animal being under examination as described with reference to FIGS. 1a-1b depicting the stimulated echo acquisition mode (STEAM) sequence, with a readout of stimulated-echo (STE) MRI signals (FIG. 1a) and optionally also the readout of spin-echo (SE) MRI signals (FIG. 1b).

Likewise the interleaved sub-sequence 1 corresponds with the set of spatially selective RF pulses 11-21-31 for a certain, further set (i=1) of M1 slices in the target volume of the human and/or animal being under examination, whereas interleaved sub-sequence N corresponds with the set (i=N) of spatially selective RF pulses 1N-2N-3N for another set of $M_N$ slices in the target volume. Preferably, but not necessarily, $M_i = M$ for $i \in [0, 1, \ldots, N]$ in which case the total number of slices that data is acquired from in a total block time is $(N+1)*M$.

Similar as to FIGS. 1a and 1b, $SB_{(j,i)}$ for $i \in [0, 1, \ldots, N]$, indicates the sequence block time during which time interval the set of spatially selective RF pulses 2i-3i are applied to the human/animal subject under examination until the end of the readout of the corresponding stimulated-echo signals $6_i$, whereas with $TB_j$ denotes the total block time.

During each total block time $TB_j$ (with $j \in [0, 1, \ldots, K]$ a number of N+1 sub-sequences, each sub-sequence consisting of $M_1$ (with $i \in [0, 1, \ldots, N]$) slices in the target volume will be acquired and during each next or following total block time $TB_{j+1}$ a further group of (N+1) sub-sequences in the target volume will be performed and acquired until the complete target volume has been imaged once, after which the complete target volume can then be imaged again.

Diffusion/crusher gradients q1 to q4, and indicated with reference numerals 4a-4d in FIGS. 1a-1b and 2a-2b, are positioned around their respective storing (Sto$_i$) Sto0-Sto1-StoN (20-21-2N) and recalling (Rec$_i$) Rec0-Rec1-RecN (30-31-3N) pulses according to their time placement.

Following the several excitation, storing and recalling RF pulses, image readouts are performed in order to obtain the respective MRI signals with an RF receiving unit of the MRI apparatus. As an example for a clarification of the method according to the invention three ($i \in [0, 1, \ldots, N]$) stimulated-echo readouts are shown in both FIGS. 2a and 2b, with reference numeral 60 being the stimulated-echo readout (STE-RO 0) belonging to sub-sequence 0, reference numeral 61 being the stimulated-echo readout (STE-RO 1) belonging to the sub-sequence 1, and reference numeral 6N pertaining to the stimulated-echo readout (STE-RO N) of the sub-sequence N.

Optionally, as a variant of the method according to the invention, in FIG. 2b additional spin-echo readouts are depicted, said image readouts being denoted with reference numeral 50 indicating the spin-echo readout (SE-RO 0) belonging to sub-sequence 0, with reference numeral 51 indicating the spin-echo readout (SE-RO 1) belonging to sub-sequence 1, and reference numeral 5N pertaining to the spin-echo readout (SE-RO N) belonging to sub-sequence N.

It is clear that the advantages of the method and apparatus according to the invention compared to the state of the art STEAM MRI data acquisition sequence implementing one set or sub-sequence (i=0) of excitation, storing and recalling RF pulses can already be obtained with one additional set or sub-sequence (i=1) of excitation, storing and recalling RF pulses.

The respective MRI signals readouts 60-61-6N (in FIGS. 2a and 2b) and optionally 50, 51, 5N (in FIG. 2b) as obtained with the RF receiving unit image of the MRI scanning apparatus each result in $M_i$ (with $i \in [0, 1, \ldots, N]$, respectively) slices being imaged in the target volume of the human and/or animal being under examination and are further computer-processed with the aid of a computer processing unit for processing said acquired MRI signals and for producing magnetic resonance image data of the target volume of the human or animal being under examination.

The spatially selective storing and recalling RF pulses 20-21-2N (Sto0-Sto1-StoN) and 30-31-3N (StoN-RecN) respectively correspond to their respective excitation pulse 10-11-1N (Exc0-Exc1-ExcN), as can be seen in FIG. 2a-2b from their schematic signal coherence pathway 80, 81 and 8N, respectively, including both spin-echo (SE) (only in FIG. 2b) and stimulated echo (STE) (in FIGS. 2a and 2b) pathways 80a-81a-8Na and 80b-81b-8Nb, respectively. Reference numeral 7 denotes (in FIGS. 1a-1b as well as in FIGS. 2a-2b) the spoiler gradient pulse S at the end of each total block time.

According to the method and the apparatus according to the invention, the radiofrequency (RF) pulse generation unit of the MRI scanning apparatus applies—during each total block time period $TB_j$ in addition to RF pulses $Exc_0$-$Sto_0$-$Rec_0$ for a certain set of $M_0$ slices—RF pulses ($Exc_i$-$Sto_i$-$Rec_i$) in a further sequence block time interval $SB_{(j,i)}$ (with $i \in [1, \ldots, N]$), with in a sub-sequence block time interval $SB^A_{(j,i)}$ of said further sequence block time interval $SB_{(j,i)}$ at least the RF pulse $Exc_i$ at $t=t_{1(j,i)}$ and the RF pulse $Sto_i$ at $t=t_{2(j,i)}$ and in the sub-sequence block time interval $SB^B_{(j,i)}$ of said sequence block time interval $SB_{(j,i)}$ at least the RF pulse $Rec_i$ at $t=t_{3(j,i)}$, with $t_{1(j,i)} < t_{2(j,i)} < t_{3(j,i)}$ and with sub-sequence block time interval $SB^A_{(j,i)}$ taking place after sub-sequence block time interval $SB^A_{(j,i-1)}$ but prior to sub-sequence block time interval $SB^B_{(j,i-1)}$ and with sub-sequence block time interval $SB^B_{(j,i-1)}$ taking place after sub-sequence block time interval $SB^B_{(j,i-1)}$.

This is clearly depicted in FIG. 2a where the RF pulse Exc1 (11) and the RF pulse Sto1 (21) (being applied during the first sub-sequence block time interval $SB^A_{(j,1)}$ of the set (i=1) of spatially selective RF pulses) are applied after the end of the (first) sub-sequence block time interval $SB^A_{(j,0)}$ of the previous set (i=0) but prior to the beginning of the (second) sub-sequence block time interval $SB^B_{(j,0)}$ of said previous set (i=0). Similarly, the RF pulse ExcN (1N) and the RF pulse StoN (2N) (being applied during the first sub-sequence block time interval $SB^A_{(j,N)}$ of the set (i=N) of spatially selective RF pulses) are applied after the end of the (first) sub-sequence block time interval $SB^A_{(j,1)}$ of the previous set (i=N−1, as N−1 is considered representing the previous set to set N. If, and only if, in an non-limiting example, N=2, this would i=1) but prior to the beginning of the (second) sub-sequence block time interval $SB^B_{(j,1)}$ of said previous set (i=N−1).

In general, for each sub-sequence $SB_{j,i}$ ($i \in [0, 1, \ldots, N]$) and for each set of spatially selective RF pulses (Exc-Sto-Rec) the RF pulse $Exc_i$ is applied at $t=t_{1(j,i)}$, the RF pulse $Sto_i$ at $t=t_{2(j,i)}$ and the RF pulse $Rec_i$ at $t=t_{3(j,i)}$, with $t_{1(j,i)} < t_{2(j,i)} < t_{3(j,i)}$ and with $t_{1(j,i-1)} < t_{1(j,i)}$, $t_{2(j,i-1)} < t_{2(j,i)}$, $t_{3(j,i-1)} < t_{3(j,i)}$.

In particular according to this example of the method and MRI scanning apparatus according to the invention and as depicted in FIG. 2a, during sequence block time $SB_{j,0}$ (corresponding with the set (i=0) of the RF pulses Exc0-Sto0-Rec0, indicated with reference numeral 10-20-30), after the end of the (first) sub-sequence block time interval $SB^A_{(j,0)}$ and prior to the end of said sequence block time $SB_{j,0}$ (more in particular prior to the start of the (second) sub-sequence block time interval $SB^B_{(j,0)}$) a further N sets of (with N at least being 1) spatially selective RF pulses (11-21, . . . , 1N-2N; corresponding to Exc1-Sto1, . . . , ExcN-StoN) in further sub-sequences (i=1, . . . , i=N) are applied.

As shown in FIG. 2a all sets of further Exc-Sto RF pulses 11-21; 1N-2N (including their corresponding gradient pulses 4a-4b) of the N further sub-sequences are applied within the so-called dead time period $TD_{j,0}$ between the sub-sequence block time intervals $SB^A_{(j,0)}$ and $SB^B_{(j,0)}$. In particular the excitation RF pulses 11, . . . , 1N (Exc1, . . . , ExcN), are applied at $t_{1(j,1)}, \ldots, t_{1(j,N)}$, with $t_{2(j,0)} < t_{1(j,1)}, \ldots, t_{1(j,N)} < t_{3(j,0)}$ and the storing pulses 21, . . . , 2N (Sto1, . . . , StoN), are applied at $t_{2(j,1)}, \ldots, t_{2(j,N)}$, with $t_{2(j,0)} < t_{2(j,1)}, \ldots, t_{2(j,0)} < t_{3(j,0)}$. More generally, the excitation RF pulses 11, . . . , 1N (Exc1, . . . , ExcN), are applied at $t_{1(j,1)}, \ldots, t_{1(j,N)}$, with $t_{2(j,i-1)} < t_{1(j,i)} < t_{3(j,i-1)}$ for i=[1, . . . , N], and the storing pulses 21, . . . , 2N (Sto1, . . . , StoN), are applied at $t_{2(j,1)}, \ldots, t_{2(j,N)}$, with $t_{2(j,1)} < t_{2(j,N)} < t_{3(j,0)}$ for i=[1, . . . , N].

By applying further sets of spatially selective RF pulses of the next sub-sequences, and in particular the excitation pulses 11, . . . , 1N (Exc1, . . . , ExcN) and the storage pulse 21, . . . , 2N (Sto1, . . . , StoN) for different groups of $M_1, \ldots, M_N$ slices, respectively, in the target volume during the mixing time of the previous sub-sequence, that is after the application of the storing pulse 20 (Sto0), and optionally SE-RO 1, but prior to the application of the recalling pulse 30 (Rec0) of the previous sub-sequence, a significant increase in the speed of scanning is obtained, allowing much more imaging slices to be acquired in the same time. Similarly these are also suitable for acquiring many volumes with different weighting for diffusion, $T_1$ or $T_2$ and subsequently calculating quantitative images which are relatively free of B1 artifacts.

In particular and as shown in FIG. 2b between $t_{2(j,0)}$ and $t_{3(j,0)}$ $T_2$-weighted and diffusion-weighted MRI signals 50 (denoted as spin-echo readout SE-RO 0) are acquired with the RF receiving unit having spatial sensitive characteristics of the MRI scanning apparatus according to the invention, whereas after $t_{3(j,0)}$ the RF receiving unit acquires T1, T2 and diffusion-weighted MRI signals 60 (also denoted as stimulated-echo readout STE-RO 0).

In this example of the method and apparatus according to the invention the active time in the sequence is expanded or lengthened by inserting additional sub-sequence block time intervals $SB^A_{(j,i)}$ between $SB^A_{(j,0)}$ and $SB^B_{(j,0)}$ and accordingly the dead time interval $TD_{j,0}$ is shortened and sequence duty cycle is increased. In particular, in this example as shown in FIG. 2b all sets of further Exc-Sto RF pulses 11-21; 1N-2N (including their corresponding gradient pulses 4a-4b) of the N further sub-sequences are applied within the now shortened dead time period $TD_{j,0}$ between the sub-sequence block time intervals $SB^A_{(j,0)}$ and $SB^B_{(j,0)}$.

Hence during each sequence block time interval $SB_{(j,i)}$ of a set i of spatially selective RF pulses ($Exc_i$-$Sto_i$-$Rec_i$) and in particular during the dead time interval $TD_{j,i}$ of said set i between the (first and second) sub-sequence block time intervals $SB^A_{(j,i)}$ and $SB^B_{(j,i)}$ one, two or more further excitation and storage pulses $Ext_{i+1}$-$Sto_{i+1}$, $Ext_{i+2}$-$Sto_{i+2}$, . . . , $Ext_{i+N}$-$Sto_{i+N}$ are applied in a sequential order after the application of the excitation and storage pulses $Ext_i$-$Sto_i$ (in FIGS. 2a-2b: Ext0-Sto0 (10-20)), but prior to the corresponding sub-sequence block time intervals $SB^B_{(j,i)}$ during which (second) sub-sequence block time intervals $SB^B_{(j,0)}$ the recalling pulse $Rec_i$ (here: Rec0 (30)) and corresponding gradient pulses 4c-4d belonging to the previous $i^{th}$ sub-sequence (in FIG. 2a-2b; i=0) is applied.

By applying further (one, two or N) sets i of spatially selective RF pulses 1i-2i-3i (Exci-Stoi-Reci) for a different set of $M_i$ slices in the target volume during the sequence block time interval $SB_{(j,i-1)}$ of the previous set of spatially selective RF pulses (Exci-1-Stoi-1-Reci-1), a significant increase in the speed of scanning is obtained, allowing much more imaging volumes to be acquired in the same time sequence. Similarly these are also suitable for calculating quantitative images which are relatively free of B1 artifacts.

In particular and as shown in FIG. 2b between $t_{2(j,0)}$ and $t_{3(j,0)}$ T2-weighted and diffusion-weighted MRI signals 50 (denoted as spin-echo readout SE-RO 0) are acquired (with T2-weighting adjustable by choosing echo time TE and diffusion-weighting adjustable by specifying length, amplitude and spacing of $q1_0$ and $q2_0$) with the RF receiving unit having spatial sensitive characteristics of the MRI scanning apparatus according to the invention, whereas after $t_{3(j,0)}$ T1, T2 and diffusion-weighted MRI signals 60 (also denoted as stimulated-echo readout STE-RO 0) are acquired (with T2-weighting adjustable by choosing echo time TE, diffusion-weighting adjustable by specifying length, amplitude and spacing of $q1_0$ and $q4_0$, and T1-weighting adjustable by choosing mixing time TM).

In particular the first RF excitation pulse of each sub-sequence 10-11, . . . , 1N (Exc0-Exc1, . . . , ExcN) exhibits a flip angle α1 exciting magnetization into the transverse plane, and the second RF storing pulse of each sub-sequence 20-21, . . . , 2N (Sto0-Sto1, . . . , StoN) exhibits a flip angle α2, thus refocussing one part of the magnetization into a spin-echo and storing another part of the magnetization along the negative longitudinal axis. The third RF recalling pulse of each sub-sequence 30-31, . . . , 3N (Rec0-Rec1, . . . , RecN) exhibits a flip angle α3, recalling the magnetization, which was stored along the negative longitudinal axis, to the transverse plane into a stimulated-echo.

Preferably, but not necessarily, a maximum signal response in the stimulated echo (STE) is provided by 90 degree flip angle in all three RF pulses Exc-Sto-Rec, and this signal is half of the achievable signal of a spin-echo sequence. Since an 180 degree flip angle pulse requires a two times higher peak power and a four times higher Specific Absorption Rate (SAR) than a 90 degree pulse, the method according to the invention is highly SAR efficient.

In the double-echo variant of the method according to the invention, both the $T_2$-weighted and diffusion-weighted (primary) spin-echos (SE-RO 0, SE-RO 1, . . . , SE-RO N), and the T2-weighted, diffusion-weighted and $T_1$-weighted stimulated-echos (STE-RO 0, STE-RO 1, . . . , STE-RO N) are read out. In the single-echo variant of the method according to the invention, the spin-echo (SE-RO 0, SE-RO 1 and SE-RO N) is omitted from all sub-sequences, and the $T_2$-weighted, diffusion-weighted and $T_1$-weighted stimulated-echos (STE-RO 0, STE-RO 1, . . . , STE-RO N) are read out. In said single-echo variant of the method according to the invention more time is available for the same mixing time between $t_{2(j,i)}$ and $t_{3(j,i)}$ which can be used to perform a greater multiplexed echo shifting (MES) or temporal interleave factor N (a higher number of N interleaved sub-sequences) for the STE-RO read-outs, compared to the double echo version.

Diffusion/crusher gradients $q1_0$-$q1_1$-$q1_N$ (the q1-gradient for interleaved sub-sequence number 0, 1, . . . , N, respectively), indicated with 40a-41a-4Na in FIGS. 1a-b and 2a-b, $q2_0$-$q2_1$-$q2_N$ (the q2-gradient for interleaved sub-sequence number 0, 1, . . . , N, respectively), indicated with 40b-41b-4Nb in FIGS. 11a-b and 2a-b; $q3_0$-$q3_1$-$q3_N$ (the q3-gradient for interleaved sub-sequence number 0, 16, . . . , N, respectively), indicated with 40c-41c-4Nc in FIGS. 11a-b and 2a-b; and $q4_0$-$q4_1$-$q4N$ (the q4-gradient for interleaved sub-sequence number 0, 1, . . . , N, respectively), indicated with 40d-41d-4Nd in FIGS. 11a-b and 2a-b, are placed in time around their respective storing Sto0-Sto1-StoN (20-21-2N) and recalling Rec0-Rec1-RecN (30-31-3N) RF pulses. In particularly, each RF storing pulse 20-21-2N (Sto0-Sto1-StoN) is surrounded by two gradient pulses 40a-41a-4Na and -40b-41b-4Nb ($q1_i$-$q2_i$, with i ∈ [0, 1, . . . , N]), respectively, with a defined vector orientation over three orthogonal gradient axes, and each RF recalling pulse 30-31-3N (Rec0-Rec1-RecN) is surrounded by two gradient pulses 40c-41c-4Nc and 40d-41d-4Nd ($q3_i$-$q4_i$, with i ∈ [0, 1, . . . , N]), respectively, with a defined vector orientation over three orthogonal gradient axes. These will crush unwanted signal pathways and can be configured to create diffusion weighted image contrast. Preferably, but not necessarily, $q1_i$=q1 for i ∈ [0, 1, . . . , N], $q2_i$=q2 for i ∈ [0, 1, . . . , N], $q3_i$=q3 for i ∈ [0, 1, . . . , N], and $q4_i$=q4 for i ∈ [0, 1, . . . , N]. Preferably, but not necessarily, $q1_i$=$q2_i$=$q4_i$ for i ∈ [0, 1, . . . , N], in which case this will create two separately diffusion weighted images for the double-echo variant, with a lower diffusion-time and diffusion-weighting (b-value) for the spin-echo readout and a higher diffusion-time and diffusion-weighting (b-value) for the stimulated-echo readout. The total speedup factor of double echo compared to a standard single echo spin-echo or STEAM sequence is therefore two times the multiplexed echo shifting (MES).

With the features of the method and the MRI scanning apparatus according to the invention a significant speedup of image acquisition can be achieved, by temporally interleaving different spatially selective echo readouts. The TM period for one spatial selection is utilized for excitation, storage and SE readout of one or more other spatial selections. The total achievable multiplexed echo shifting (MES) factor N is determined by the required TM, choice for single-echo (STE-RO only) or double echo (STE-RO and SE-RO) version, and timing and duration of RF pulses, q gradient pulses and image readouts. Longer mixing time TM allows higher MES factor and greater speedup.

The spatially selective RF pulses can be single slice, multi-band (MB) or simultaneous multi-slice (SMS) pulses. Each selected slice can be further spatially encoded along the slice direction by additional phase encoding (3D imaging with two phase encoding directions).

The interleaving of the differently spatially selective echo readouts allow greatly faster T1-, T2 and diffusion-weighted MRI acquisitions than existing sequences. This allows for fast quantitative imaging and this approach is feasible at high (i.e. 3T) ultra-high (i.e. 7T and above) field strengths due to its SAR efficiency. In addition, existing and future SAR efficient RF pulse designs can be used to benefit from their further SAR efficiency.

Each set of RF pulses per time sequence can be a sequence of RF pulses with flip angle with flip angle $0°<α_i≤180°$, but are preferably 90° flip angle pulses. A spin echo sequence with a 180° flip angle pulse requires a two times higher peak power and a four times higher Specific Absorption Rate (SAR) than a 90° pulse. Diffusion weighting is created by the q1-q2 pulse pair 4a-4b for the spin echo read out and the q3-q4 pulse pair 4c-4d for the stimulated-echo readout. See all FIGS. 1a-1b and 2a-2b.

LIST OF REFERENCE NUMERALS

10 Excitation RF pulse slice group 0 (Exc0) [i=0; $0^{th}$ sequence block]
20 Storing RF pulse slice group 0 (Sto0)
30 Recalling RF pulse slice group 0 (Rec0)
50 Spin-echo readout group 0 (SE-RO 0)
60 Stimulated-echo readout group 0 (STE-RO 0)

11 Excitation RF pulse slice group 1 (Exc1) [i=1; $1^{st}$ sequence block]
21 Storing RF pulse slice group 1 (Sto1)
31 Recalling RF pulse slice group 1 (Red)
51 Spin-echo readout group 1 (SE-RO 1)
61 Stimulated-echo readout group 1 (STE-RO 1)
1N Excitation RF pulse slice group N (ExcN) [i=N; $N^{th}$ sequence block]
2N Storing RF pulse slice group N (StoN)
3N Recalling RF pulse slice group N (RecN)
5N Spin-echo readout group N (SE-RO N)
6N Stimulated-echo readout group N (STE-RO N)
4a Diffusion/Crusher gradient 1 (q1)
4b Diffusion/Crusher gradient 2 (q2)
4c Diffusion/Crusher gradient 3 (q3)
4d Diffusion/Crusher gradient 4 (q4)
7 Spoiler gradient (S)
80-81-8N $0^{th}$, $1^{st}$ and $N^{th}$ sequence block signal pathway
80a-81a-8Na spin-echo (SE) signal pathway of $0^{th}$, $1^{st}$ and $N^{th}$ sequence block
80b-81b-8Nb stimulated echo (STE) signal pathway of $0^{th}$, $1^{st}$ and $N^{th}$ sequence block
$SB_{(j,i)}$ Sequence Block time of $i^{th}$ sequence block and $j^{th}$ total block
$SB^A_{(j,i)}$ (first) sub-sequence block time A of $i^{th}$ sequence block and $j^{th}$ total block
$SB^B_{(j,i)}$ (second) sub-sequence block time B of $i^{th}$ sequence block and $j^{th}$ total block
$TD_{(j,i)}$ Dead Time of $i^{th}$ sequence block and $j^{th}$ total block
$TB_j$ Total Block time for $j^{th}$ total block

The invention claimed is:

1. A method for obtaining images of a target volume of a human and/or animal subject using magnetic resonance imaging (MRI), said method comprising at least the steps of:
  A applying, to said human and/or animal subject being positioned in an MRI scanning apparatus, during subsequent total block times $TB_j$ with j ∈ [1, 2, . . . , K] a first set of spatially selective RF pulses (Exc0-Sto0-Rec0) in a sequence block $SB_{(j,0)}$, with in a sub-sequence block $SB^A_{(j,0)}$ of said sequence block $SB_{(j,0)}$ at least a first RF pulse (Exc0) at $t=t_{1(j,0)}$ and a second RF pulse (Sto0) at $t=t_{2(j,0)}$ and in a sub-sequence block $SB^B_{(j,0)}$ of said sequence block $SB_{(j,0)}$ at least a third RF pulse (Rec0) at $t=t_{3(j,0)}$, with $t_{1(j,0)}<t_{2(j,0)}<t_{3(j,0)}$, with each RF pulse simultaneously exciting respective $M_0$ slices in the target volume of the human and/or animal subject, thereby causing the subject to emit MRI signals, said MRI signals at least comprising stimulated-echo (STE) MRI signals producing data for $M_0$ slices in said target volume;
  B acquiring during said total block times $TB_j$ at least the MRI signals with at least a RF receiving unit having spatial sensitive characteristics; and
  C computer-processing the MRI signals as acquired with said RF receiving unit in order to produce magnetic resonance image data for each of said $M_0$ slices of the target volume; and wherein the method further comprises the step of:
  D applying, to said human and/or animal subject being positioned in said MRI scanner, at least a further sequence block $SB_{(j,i)}$ (with i ∈ [1, N]) of spatially selective RF pulses ($Exc_i$-$Sto_i$-$Rec_i$), with in a sub-sequence block $SB^A_{(j,i)}$ of said further sequence block $SB_{(j,i)}$ at least a first RF pulse ($Exc_i$) at $t=t_{1(j,i)}$ and a second RF pulse ($Sto_i$) at $t=t_{2(j,i)}$ and in a sub-sequence block $SB^B_{(j,i)}$ of said sequence block $SB_{(j,i)}$ at least a third RF pulse ($Rec_i$) at $t=t_{3(j,i)}$ with $t_{1(j,i)}<t_{2(j,i)}<t_{3(j,i)}$ and with sub-sequence block $SB^A_{(j,i)}$ taking place after sub-sequence block $SB^A_{(j,i-1)}$ but prior to sub-sequence block $SB^B_{(j,i-1)}$ and with sub-sequence block $SB^B_{(j,i)}$ taking place after sub-sequence block $SB^B_{(j,i-1)}$ with each RF pulse simultaneously exciting respective $M_i$ slices in the target volume of the human and/or animal subject, thereby causing the subject to emit further MRI signals, said further MRI signals at least comprising stimulated-echo (STE) MRI signals producing further data for $\Sigma^N_{i=1} M_i$ slices in said target volume.

2. A MRI scanning apparatus for obtaining images of a target volume of a human and/or animal subject using magnetic resonance imaging (MRI), said MRI scanning apparatus at least comprising:
  a housing defining a target area for accommodating said human and/or animal subject;
  at least one main magnet unit and at least one magnetic gradient unit for applying—during use—one or more magnetic gradient fields in said target area, as well as
  at least one radiofrequency (RF) pulse generation unit for applying, during subsequent total block times $TB_j$ with j ∈ [1, 2, . . . , K] a first set of spatially selective RF pulses (Exc0-Sto0-Rec0) in a sequence block $SB_{(j,0)}$, with in a sub-sequence block $SB^A_{(j,0)}$ of said sequence block $SB_{(j,0)}$ at least a first RF pulse (Exc0) at $t=t_{1(j,0)}$ and a second RF pulse (Sto0) at $t=t_{2(j,0)}$ and in a sub-sequence block $SB^B_{(j,0)}$ of said sequence block $SB_{(j,0)}$ at least a third RF pulse (Rec0) at $t=t_{3(j,0)}$, with $t_{1(j,0)}<t_{2(j,0)}<t_{3(j,0)}$, with each RF pulse simultaneously exciting respective $M_0$ slices in the target volume of the human and/or animal subject, thereby causing the subject to emit MRI signals, said MRI signals at least comprising stimulated-echo (STE) MRI signals producing data for $M_0$ slices in said target volume;
  a RF receiving unit for acquiring during said total block times $TB_j$ said MRI signals having spatial sensitive characteristics; and
  a computer processing unit for processing said acquired MRI signals and for producing said magnetic resonance image data, wherein said (RF) pulse generation unit is arranged to apply, to said human and/or animal subject being positioned in said MRI scanner, at least a further set i (with i ∈ [1, . . . , N]) of spatially selective RF pulses ($Exc_i$-$Sto_i$-$Rec_i$) in a further sequence block $SB_{(j,i)}$ (with i ∈ [1, . . . , N]), with in a sub-sequence block $SB^A_{(j,i)}$ of said further sequence block $SB_{(j,i)}$ at least a RF pulse $Exc_i$ at $t=t_{1(j,i)}$ and a RF pulse $Sto_i$ at $t=t_{2(j,i)}$ and in a sub-sequence block $SB^B_{(j,i)}$ of said sequence block $SB_{(j,i)}$ at least a RF pulse $Rec_i$ at $t=t_{3(i,j)}$, with $t_{1(j,i)}<t_{2(j,i)}<t_{3(j,i)}$ and with sub-sequence block $SB^A_{(j,i)}$ taking place after sub-sequence block $SB^A_{(j,i-1)}$ but prior to sub-sequence block $SB^B_{(j,i-1)}$ and with sub-sequence block $SB^B_{(j,i)}$ taking place after sub-sequence block $SB^B_{(j,i-1)}$, with each RF pulse simultaneously exciting respective $M_i$ slices in the target volume of the human and/or animal subject, thereby causing the subject to emit further MRI signals, said further MRI signals at least comprising stimulated-echo (STE) MRI signals producing further data for $\Sigma^N_{i=1} M_i$ slices in said target volume.

3. Method according to claim 1, wherein said MRI signals also comprises spin-echo (SE) MRI signals acquired in sub-sequence block $SB^A_{(j,i)}$.

4. Method according to claim 1, wherein each set i (with i ∈ [0, 1, . . . , N]) of spatially selective RF pulses comprises:
  the RF excitation pulse ($Exc_i$) exhibiting a flip angle α1 exciting magnetization into the transverse plane, the RF storing pulse ($Sto_i$) exhibiting a flip angle α2 for refocussing one part of the magnetization into a spin-echo, thereby causing the subject to emit, during said total block time $TB_j$, N+1 spin-echo MRI signals, and storing another part of the magnetization along the longitudinal axis, and the RF recalling pulse ($Rec_i$) exhibiting a flip angle α3 for recalling the magnetization, which was stored along the longitudinal axis, to the transverse plane into a stimulated-echo, thereby causing the subject to emit, during said total block time $TB_j$, N+1 stimulated-echo MRI signals and where each $Sto_i$ and $Rec_i$ RF pulse are each surrounded by two gradient pulses with a defined vector orientation over three orthogonal gradient axes.

5. The method for obtaining images of a target volume of a human and/or animal subject using magnetic resonance imaging (MRI) according to claim 1, wherein for each sequence block $SB_{(j,i)}$ each of the sets of RF pulses being applied comprises a RF pulse Exci applied at $t=t_{1(j,i)}$, a RF pulse $Sto_i$ applied at $t=t_{2(j,i)}$ and a RF pulse $Rec_i$ applied at $t=t_{3(j,i)}$, with $t_{1(j,i)}<t_{2(j,i)}<t_{3(j,i)}$, and with $t_{1(j,i-1)}<t_{1(j,i)}$, $t_{2(j,i-1)}<t_{2(j,i)}$, $t_{3(j,i-1)}<t_{3(j,i)}$ and with $t_{2(j,i-1)}<t_{1(j,i)}$, . . . , $t_{1(j,N)}<t_{3(j,i-1)}$ and with $t_{2(j,i-1)}<t_{2(j,i)}$, . . . , $t_{2(j,N)}<t_{3(j,i-1)}$.

6. The method for obtaining images of a target volume of a human and/or animal subject using magnetic resonance imaging (MRI) according to claim 3, further comprising the steps of:

between $t_{2(j,i)}$ and $t_{3(j,i)}$ acquiring T2-weighted and diffusion-weighted spin-echo (SE) MRI signals;

after $t_{3(j,i)}$ acquiring T1, T2 and diffusion-weighted stimulated-echo (STE) MRI signals.

7. The method for obtaining images of a target volume of a human and/or animal subject using magnetic resonance imaging (MRI) according to claim 1, wherein the sets of RF pulses are a sequence of RF pulses with flip angle with flip angle $0°<α_1≤180°$, in particular the $Exc_i$ RF excitation pulse of each sequence block exhibits a flip angle $0°<α_1<180°$, and the $Sto_i$ RF storing pulse of each sequence exhibits a flip angle $0°<α_2<180°$ and the $Rec_i$ RF recalling pulse of each sequence exhibits a flip angle $0°<α_3<180°$.

8. The method for obtaining images of a target volume of a human and/or animal subject using magnetic resonance imaging (MRI) according to claim 1, wherein each RF pulse is a single-band or multi-band/simultaneous multi-slice RF pulse.

9. The method for obtaining images of a target volume of a human and/or animal subject using magnetic resonance imaging (MRI) according to claim 1, wherein each slice selected by a single-band or multi-band pulse is spatially encoded along the slice direction by additional phase encoding.

10. The method for obtaining images of a target volume of a human and/or animal subject using magnetic resonance imaging (MRI) according to claim 1, wherein $M_i=M$ for i ∈ [0, 1, . . . , N] in which case the total number of slices acquired from in a total block time is (N+1)*M.

11. The method for obtaining images of a target volume of a human and/or animal subject using magnetic resonance imaging (MRI) according to claim 1, wherein each RF storing pulse ($Sto_i$) is surrounded by two gradient pulses ($q1_i$-$q2_i$, with i ∈ [0, 1, . . . , N]), respectively, with a defined vector orientation over three orthogonal gradient axes, and each RF recalling pulse ($Rec_i$) is surrounded by two gradient pulses ($q3_i$-$q4_i$, with i ∈ [0, 1, . . . , N]), respectively, with a defined vector orientation over three orthogonal gradient axes and in a further example $q1_i=q1$ for i ∈ [0, 1, . . . , N], $q2_i=q2$ for i ∈ [0, 1, . . . , N], $q3_i=q3$ for i ∈ [0, 1, . . . , N], and $q4_i=q4$ for i ∈ [0, 1, . . . , N], and $q1_i=q2_i=q4_i$ for i ∈ [0, 1, . . . , N].

12. The MRI scanning apparatus according to claim 2, wherein said MRI signals also comprises spin-echo (SE) MRI signals.

13. The MRI scanning apparatus according to claim 2, wherein said RF pulse generation unit is arranged in applying a set i (with i ∈ [0, 1, . . . , N]) of spatially selective RF pulses, of which the RF excitation pulse (Exci) exhibiting a flip angle α1 exciting magnetization into the transverse plane, the RF storing pulse (Stoi) exhibiting a flip angle α2 for refocussing one part of the magnetization into a spin-echo, thereby causing the subject to emit, during said total block time $TB_j$, N+1 spin-echo MRI signals, and storing another part of the magnetization along the longitudinal axis, and the RF recalling pulse (Reci) exhibiting a flip angle α3 for recalling the magnetization, which was stored along the longitudinal axis, to the transverse plane into a stimulated-echo, thereby causing the subject to emit, during said total block time $TB_j$, N+1 stimulated-echo MRI signals and where each $Sto_i$ and $Rec_i$ RF pulse are each surrounded by two gradient pulses with a defined vector orientation over three orthogonal gradient axes.

14. The MRI scanning apparatus according to claim 2, wherein said (RF) pulse generation unit is furthermore arranged in applying, for each sequence block $SB_{(j,i)}$ and for each of the sets of RF pulses, a RF pulse $Exc_i$ applied at $t=t_{1(j,i)}$, a RF pulse Stoi applied at $t=t_{2(j,i)}$ and a RF pulse $Rec_i$ applied at $t=t_{3(j,i)}$, with $t_{1(j,i)}<t_{2(j,i)}<t_{3(j,i)}$, and with $t_{1j, i-1}<t_{1(j,i)}$, $t_{2(j,i-1)}<t_{2(j,i)}$, $t_{3(j,i-1)}<t_{3(j,i)}$ and with $t_{2(j,i-1)}<t_{1(j,i)}$, . . . , $t_{1(j,N)}<t_{3(j,i-1)}$ and with $t_{2(j,i-1)}<t_{2(j,i)}$, . . . , $t_{2(j,N)}<t_{3(j,i-1)}$.

15. The MRI scanning apparatus according to claim 14, wherein the RF receiving unit is further arranged in:

acquiring between $t_{2(j,i)}$ and $t_{3(j,i)}$ T2-weighted and diffusion-weighted spin-echo (SE) MRI signals; and acquiring after $t_{3(j,i)}$ T1, T2 and diffusion-weighted stimulated-echo (STE) MRI signals.

16. The MRI scanning apparatus according to claim 1, wherein said RF pulse generation unit is furthermore arranged to apply the sets of RF pulses as a sequence of RF pulses with flip angle with flip angle $0°<α_i<180°$, wherein in particular the $Exc_i$ RF excitation pulse of each sequence exhibits a flip angle $0°<α_1<180°$, and the $Sto_i$ RF storing pulse of each sequence exhibits a flip angle $0°<α_2<180°$ and the $Rec_i$ RF recalling pulse of each sequence exhibits a flip angle $0°<α_3<180°$.

* * * * *